United States Patent
Rubenstein et al.

(10) Patent No.: US 6,685,489 B1
(45) Date of Patent: Feb. 3, 2004

(54) CIRCUIT BOARD LEVERAGE MECHANISM

(75) Inventors: Brandon Rubenstein, Loveland, CO (US); Bradly Clements, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/279,524

(22) Filed: Oct. 24, 2002

(51) Int. Cl.[7] .............................................. H01R 13/62
(52) U.S. Cl. ........................................................ 439/157
(58) Field of Search ............................... 439/159, 160, 439/157

(56) References Cited

U.S. PATENT DOCUMENTS

| | | | | |
|---|---|---|---|---|
| 4,152,038 A | * | 5/1979 | Inouye et al. | 439/157 |
| 4,256,356 A | * | 3/1981 | Roth | 439/157 |
| 4,914,552 A | * | 4/1990 | Kecmer | 439/157 |
| 4,982,303 A | * | 1/1991 | Krenz | 439/157 |
| 5,110,301 A | * | 5/1992 | Inoue et al. | 439/157 |
| 5,496,186 A | * | 3/1996 | Dobbelaere et al. | 439/157 |
| 5,793,614 A | * | 8/1998 | Tollbom | 439/160 |
| 6,045,377 A | * | 4/2000 | Kajiura | 439/159 |
| 6,354,164 B1 | * | 3/2002 | Megason et al. | 439/157 |

* cited by examiner

Primary Examiner—Gary Paumen

(57) ABSTRACT

A circuit board leverage mechanism. In one embodiment, a leverage mechanism includes a first gear member configured to rotatably mount to a circuit board, the first gear member including gear teeth and at least one tab that is configured to engage a card guide in which the circuit board may be inserted, and a second gear member configured to rotatably mount to the circuit board in proximity to the first gear member, the second gear member including gear teeth that mesh with the gear teeth of the first gear member, the second gear member further including a lever, wherein rotation of the lever effects rotation of the second gear member and opposite rotation of the first gear member which causes the at least one tab of the first gear member to engage the card guide and urge the circuit board into or out of contact with an electrical connector.

29 Claims, 4 Drawing Sheets

CIRCUIT BOARD LEVERAGE MECHANISM

BACKGROUND

Various electrical components may be placed on a circuit board that facilitates the electrical components' electrical connection to a computing device. For instance, components such as processors, memory modules, and peripheral devices may be mounted to a circuit board that can be inserted into and removed from a computing device such as a computer housing or "box."

Circuit boards are often configured for insertion into a card bay of the computing device in which they are to be used. Various card slots are provided in the card bay to guide the circuit boards to an electrical connector, such as a pin connector, that is configured to couple with connector elements, such as pins, provided on the circuit boards.

Typically, it is desirable to permit insertion and removal of the circuit boards so that the circuit boards may be replaced, for instance to replace defective elements or upgrade hardware. Such insertion and removal can, however, be physically difficult, particularly where a plurality of pins must be inserted into or removed from a pin connector. In particular, a large amount of force may be necessary to both insert the pins into the pin connector, and remove the pins from the connector.

To aid the user in inserting and removing circuit boards and to prevent damage to the circuit boards or the connectors to which they connect, leverage mechanisms are sometimes provided that provide a mechanical advantage to the user during the insertion or removal process. Typically, such leverage mechanisms comprise a simple lever that, when pulled or pushed (as the case may warrant), forces the circuit board into or out of contact with its electrical connector. More particularly, many leverage mechanisms comprise a lever that is connected to a tab or latch that is configured to interface with a lip provided in the card bay. When the lever is actuated (i.e., rotated), the tab or latch is forced against the lip to either force the circuit board into or out of contact with its electrical connector, depending upon the rotational direction in which it is moved.

Although providing the mechanical advantage required to insert or remove the circuit board without difficulty, existing leverage mechanisms require a relatively large amount of space to accommodate the lever because the lever must normally be relatively long to provide the required amount of leverage and therefore requires a relatively large amount of real estate adjacent the edges of the circuit boards with which they are used. In some applications, there simply is not enough room for these long levers due to other computing device components or housing frame. Therefore, the circuit board must either be moved to a card slot in which greater space is available, or the leverage mechanism must be removed, thereby requiring the user to insert and remove the circuit board without the mechanical advantage normally provided by the mechanism.

SUMMARY

Disclosed is a circuit board leverage mechanism. In one embodiment, a leverage mechanism comprises a first gear member configured to rotatably mount to a circuit board, the first gear member including gear teeth and at least one tab that is configured to engage a card guide in which the circuit board may be inserted, and a second gear member configured to rotatably mount to the circuit board in proximity to the first gear member, the second gear member including gear teeth that mesh with the gear teeth of the first gear member, the second gear member further including a lever, wherein rotation of the lever effects rotation of the second gear member and opposite rotation of the first gear member which causes the at least one tab of the first gear member to engage the card guide and urge the circuit board into or out of contact with an electrical connector.

BRIEF DESCRIPTION OF THE DRAWINGS

The disclosed mechanism can be better understood with reference to the following drawings. The components in the drawings are not necessarily to scale.

DETAILED DESCRIPTION

As identified above, known circuit board leverage mechanisms generally require a large amount of space and therefore may not be usable in all situations. As is discussed in greater detail below with reference to the figures, adequate mechanical leverage can be provided in a much smaller space where a gearing system is used. The following describes an example embodiment of a circuit board leverage mechanism that incorporates a gearing system and which, therefore, requires less space.

Figure 1:
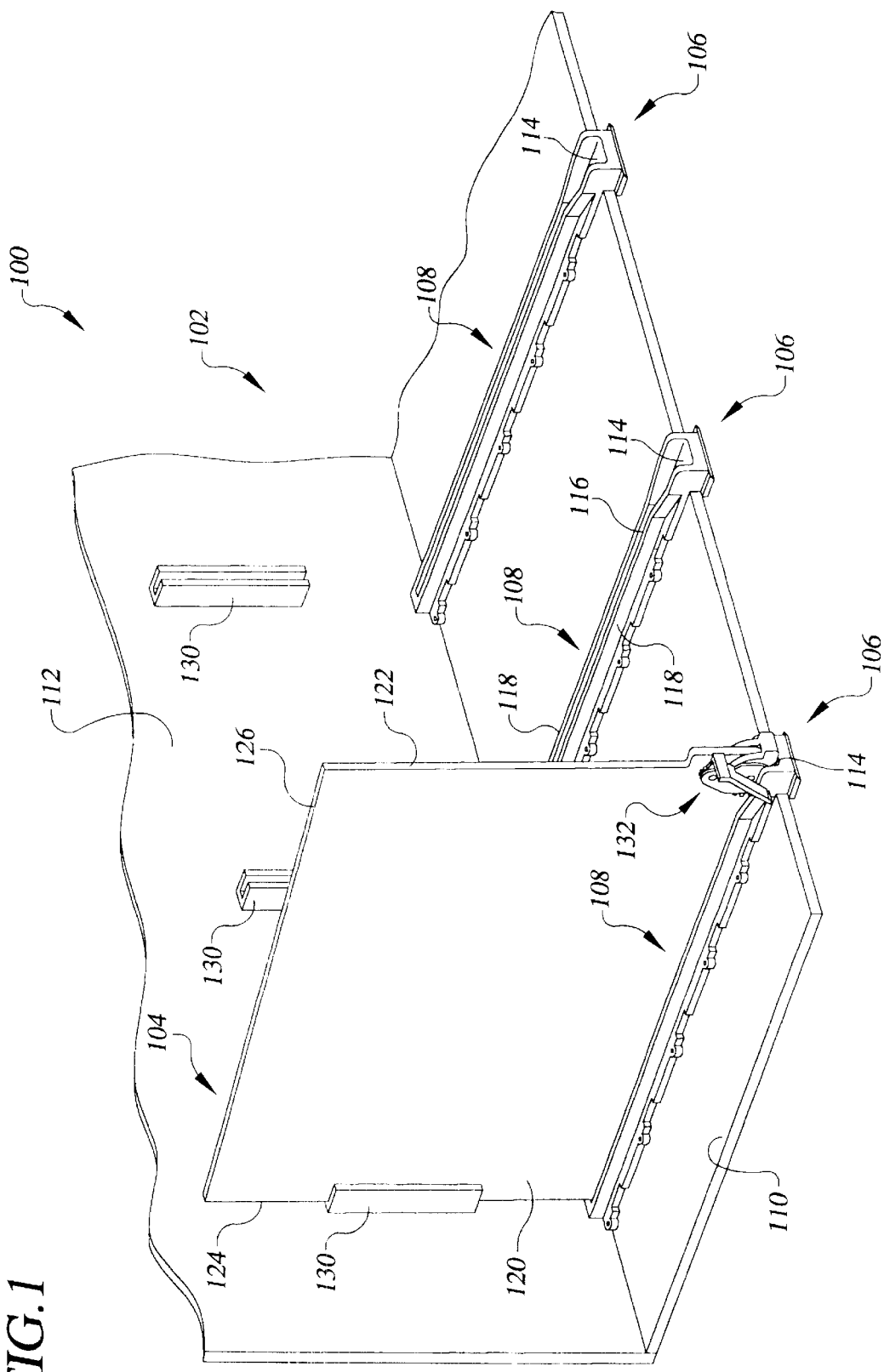
FIG. 1 is a partial perspective view of a card bay of a computing device that is configured to receive circuit boards.

Referring now in more detail to the drawings, in which like numerals indicate corresponding parts throughout the several views, FIG. 1 illustrates a card bay 100 of a computing device (not shown) that defines an interior space 102 that is configured to receive one or more circuit boards 104. The card bay 100 includes one or more card slots 106 that comprise card guides 108 which guide the circuit boards along a surface 110 of the card bay to a back plane 112 of the bay. As indicated in the figure, the card guides 108 generally comprise a mouth portion 114 in which the circuit boards 104 are received. The mouth portion 114 of each card guide 108 leads to an elongated groove 116 that is defined by opposed side walls 118 and which extends from the mouth to the back plane 112.

Figure 2:
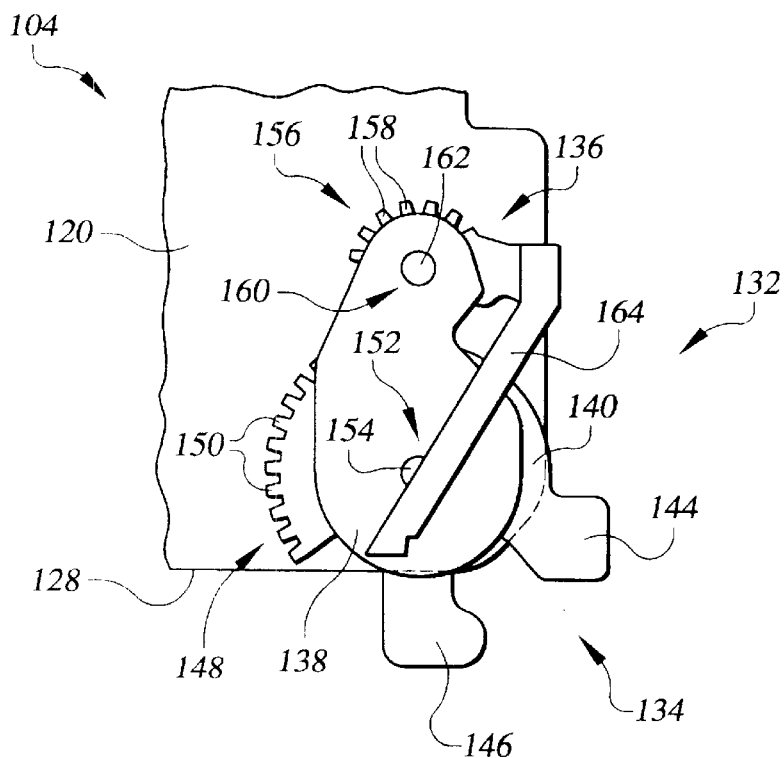
FIG. 2 is a first partial side view of a circuit board that may be inserted into the card bay of FIG. 1 and that includes a leverage mechanism.

The circuit board 104 generally comprises a planar body having side surfaces 120 (only one shown in FIG. 1) that are defined by a front edge 122, a rear edge 124, a top edge 126, and a bottom edge 128 (see FIG. 2). Although absolute spatial terms such as "front" and "top" are used, it is to be understood that these terms are merely used for convenience to describe the circuit board 104 as shown oriented in FIG. 1.

As identified above, the card guides 108 guide circuit boards 104 toward the back plane 112 of the card bay 100.

More particularly, the card guides 108 guide circuit boards 104 into firm contact with electrical connectors 130 mounted to or provided at the back plane 112. By way of example, the electrical connectors 130 comprise pin connectors that are configured to receive pins (not shown) provided along the rear edge 124 of the circuit boards 104.

To aid in the insertion and/or removal of a circuit board 104, one or more leverage mechanisms are provided adjacent the front edge 122 of the board. In the example embodiment of FIG. 1, one such leverage mechanism 132 is provided at the corner of the circuit board 104 defined by the front edge 122 and the bottom edge 128 (FIG. 2) of the board. Although only one such leverage mechanism 132 is depicted, a substantially identical leverage mechanism can also be provided at the corner of the circuit board 104 defined by the front edge 122 and the top edge 126 of the board, if desired. In such a case, the tope edge 126 will typically be received by a further card guide (not shown) substantially identical to the card guide 108 that receives the bottom edge 128.

In the orientation shown in FIG. 1, the leverage mechanism 132 is engaged with a card guide 108 such that the circuit board 104 is completely inserted into its card slot 106, and the board is firmly connected to the electrical connector 130 aligned with that card slot. As is described below, the leverage mechanism 132 can be used to eject the circuit board 104 from its electrical connector 138, as well as to insert the board into the connector as shown in FIG. 1.

Figure 3:
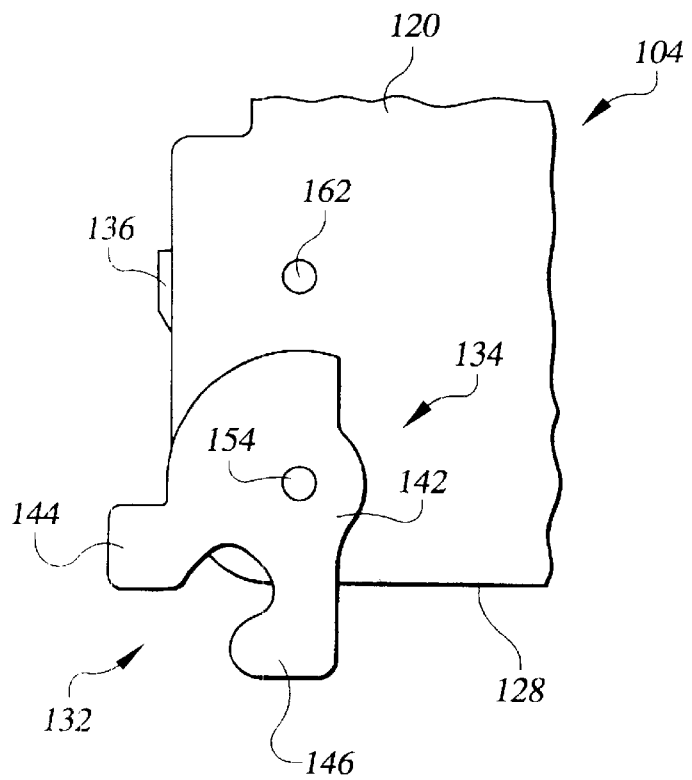
FIG. 3 is second partial side view of the circuit board and leverage mechanism shown in FIG. 2.
Figure 4:
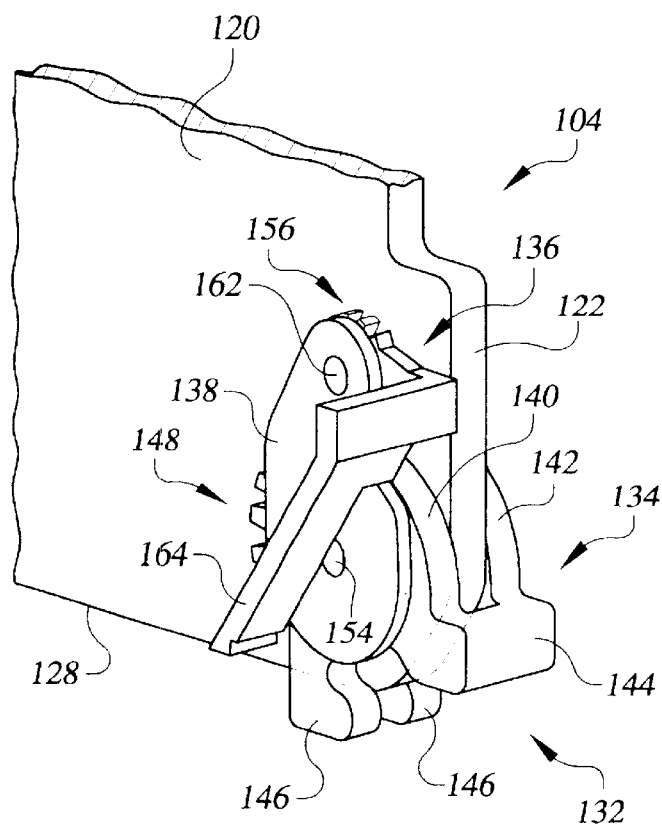
FIG. 4 is a partial perspective view of the circuit board and leverage mechanism shown in FIGS. 2 and 3.

FIGS. 2–4 illustrate the leverage mechanism 132 in greater detail. As indicated in these figures, the leverage mechanism 132 includes a first gear member 134, a second gear member 136 disposed in proximity to the first gear member, and a mounting plate 138 that overlies both members. Each of these components is made of a strong material such as a metal or plastic material. As is apparent from FIG. 4, the first gear member 134 comprises first and second lateral portions 140 and 142 that are positioned on opposite sides of the circuit board 104, respectively. The lateral portions 140, 142 are joined together with a first tab or latch 144. As is discussed below, this first tab 144 is used to aid in ejection of the circuit board 104 from its card slot and, more particularly, to interface with a card guide 108. In addition to the first tab 144, each lateral portion 140 and 142 includes a second tab or latch 146 that is substantially identical in configuration to the opposing tab. As is discussed below, the second tabs 146 are used to aid in insertion of the circuit board 104 into its card slot and, like tab 144, is used to interface with a card guide 108. Although two such second tabs 146 are illustrated and have been described, only one such second tab may be used, if desired.

With particular reference to FIG. 2, one of the lateral portions (portion 140 in the embodiment of FIG. 2) is provided with an arcuate edge 148 upon which is provided a plurality of gear teeth 150. The arcuate edge 148 typically has a constant radius relative to a rotation axis 152 of the first gear member 134. By way of example, the radius to the outer extent of the arcuate edge 148 (i.e., including gear teeth 150) is approximately 19 millimeters (mm). Positioned at the rotation axis 152 and rotatably mounting the first gear member 134 in place on the circuit board 104, but permitting it to rotate about the rotation axis, is a first pin 154 that, for example, is press fit into place. As is apparent from FIGS. 2–4, the first pin 154 extends through the mounting plate 138, through the first lateral portion 140, through the circuit board 104, and through the second lateral portion 142. With this arrangement, the first lateral portion 140 of the first gear member 134 is positioned between the mounting plate 138 and the circuit board 104.

As indicated best in FIGS. 2 and 4, the second gear member 136 also includes an arcuate edge 156 that includes gear teeth 158. These gear teeth 158 are sized and configured so as to mesh with the gear teeth 150 of the first gear member 134. The arcuate edge 156 typically has a constant radius relative to a rotation axis 160 of the second gear member 134. This radius is selected relative to the position of the rotation axis 160 such that the gear teeth 158 engage the gear teeth 150 of the first gear member 134. By way of example, the radius to the outer extent of the arcuate edge 156 (i.e., including gear teeth 158) is approximately 8.5 mm. The second gear member 136 is rotatably mounted on the circuit board 104 with a second pin 162 that, for example, is press fit into place at the rotation axis 160 such that the second gear member 136 is free to rotate about the rotation axis. As indicated in FIGS. 2–4, the second pin 162 extends through the mounting plate 138, through the second gear member 136, and into the circuit board 104 (see FIG. 3). With this arrangement, the second gear member 136, like the first lateral portion 140 of the first gear member 134, is positioned between the mounting plate 138 and the circuit board 104. Accordingly, the mounting plate 138 overlies the first and second gear members 134 and 136 so that the members are held in place by the mounting plate so as to be in engagement with each other such so that rotation of the second gear member effects opposite rotation of the first gear member.

The second gear member 136 further comprises a lever 164 that, when actuated by the user, causes rotation of the second gear member and, as noted above, rotation of the first gear member 134. This lever 164 may be integrally formed with the remainder of the second gear member or may be affixed thereto. As indicated in FIGS. 2 and 4, the lever 164 is relatively short in length. By way of example, the lever is approximately 18.5 mm long from its outer end to its proximal end adjacent the rotation axis 162. In addition, the lever 164 is arranged so as to overlie the mounting plate 138 such that the lever exists within lateral bounds of the leverage mechanism 132 when in the closed position indicated in FIG. 2. With this arrangement, the leverage mechanism 132 requires much less space than known leverage mechanisms. By way of example, the mechanism may require only half of much space along a length of the front edge 122 of the circuit board as compared to known leverage mechanisms.

The radius of the arcuate edge 156 of the second gear member 136 is typically smaller than the radius of the arcuate edge 148 of the first gear member 134 to provide mechanical advantage. By way of example, the radius of the arcuate edge 156 is approximately 2.3 times smaller than that of the arcuate edge 148. Such an arrangement provides leverage that the user can use when inserting or ejecting the circuit board 104. By way of example, the combined mechanical advantage provided by the aforementioned gear ratio and the lever 164 is a 5:1 mechanical advantage. In other words, when the user applies a given force to the lever 164 to rotate it, an equivalent force of five times the magnitude of the applied force is available for urging the circuit board 104 into or out of contact with its associated electrical connector 130. Although two gear surfaces have been identified, more gear surfaces could be used to achieve the desired mechanical advantage. Accordingly, one or more intermediate gears could be positioned between the first and second gear members 134 and 136, if desired, in obtaining the desired mechanical advantage. Where an odd number of gears are added, the direction of rotation of the lever 164 relative to the displacement of the circuit board 104 can be reversed.

Figure 5:
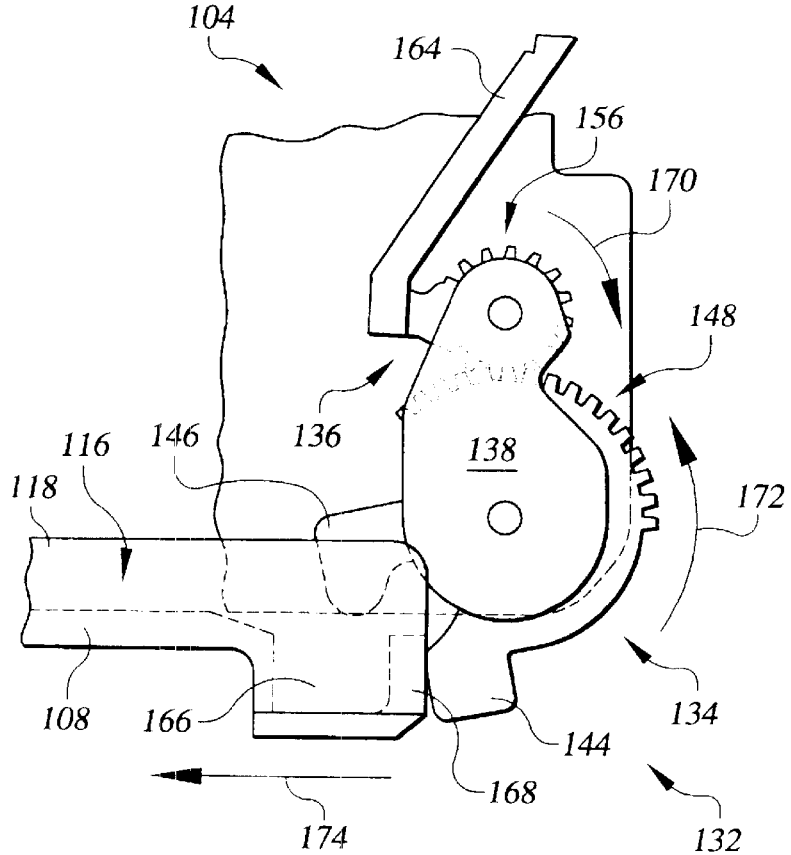
FIG. 5 is a partial side view depicting insertion of the circuit board shown in FIGS. 2–4 into a card slot of the card bay of FIG. 1.

The general construction of the disclosed leverage mechanism embodiment having been described above, use of the mechanism 132 will now be described with reference to FIGS. 5–7. Beginning with FIG. 5, insertion of the circuit board 104 into its card slot will first be described. As indicated in FIG. 5, the circuit board 104 is first manually slid along the elongated groove 116 of the selected card guide 108 with the lever 164 in an extended position (see figure) until the second tabs 146 of the leverage mechanism 132 are positioned over the mouth 114 of the card guide. More particularly, the circuit board 104 is inserted by hand along the elongated groove 116 until the second tabs 146 are positioned over a cavity 166 defined in the mouth 114 of the card guide 108 by a front lip 168. Once in this position, the circuit board 104 will be positioned adjacent its electrical connector 130 provided at the back plane 112 of the card bay 100 (see FIG. 1). In some cases, the circuit board 104 may actually contact the electrical connector 130.

At this point, the circuit board 104 can be urged into firm contact with the electrical connector 130 by rotating the lever 164 of the second gear member 136 toward the remainder of the leverage mechanism 132 (downwardly in FIG. 5) so as to cause the arcuate edge 156 and the teeth 158 provided thereon to rotate in a clockwise direction (as indicated by arrow 170). Due to the meshing of the teeth 158 with the teeth 150 of the first gear member 134, the first gear member will rotate in a counter-clockwise direction (as indicated by arrow 172). As the first gear member 134 rotates counter-clockwise, the second tabs 146 will engage the inner surface of the lip portion 168 of the card guide 108. In that the card guide 108 is securely fixed within the card bay 100, continued rotation of the lever 164 will force the circuit board 104 along the elongated groove 116 (in the direction of arrow 174) and into its associated electrical connector 130. Once the lever 164 is fully rotated as indicated in FIG. 6, the second tabs 146 are contained within the cavity 166 and the circuit board 104 is firmly connected to the electrical connector 130.

Figure 6:
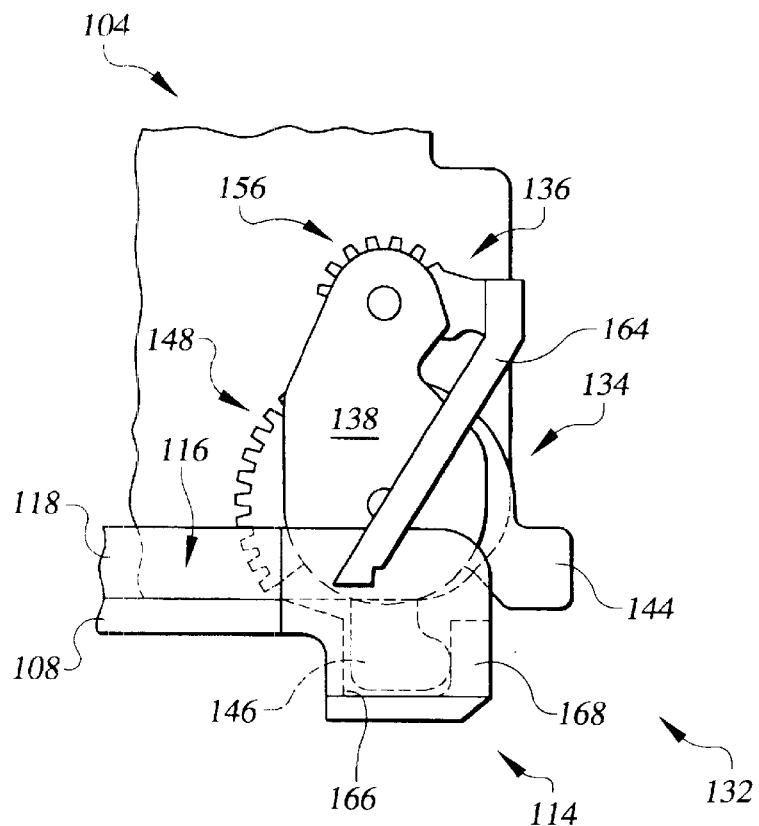
FIG. 6 is a partial side view depicting complete insertion of the circuit board shown in FIGS. 2–4 into a card slot of the card bay of FIG. 1.
Figure 7:
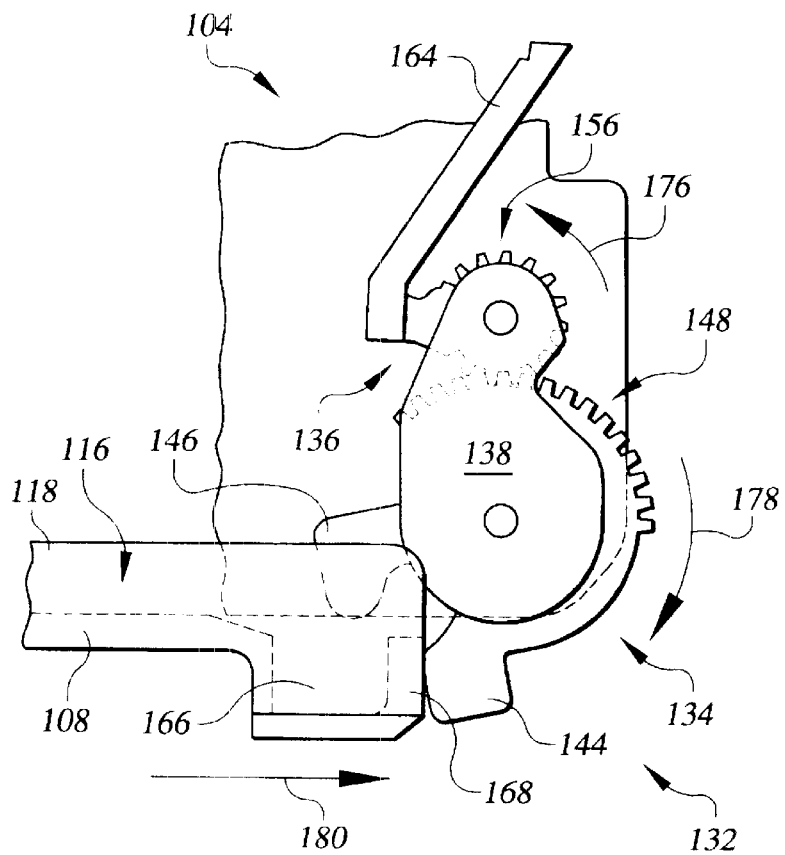
FIG. 7 is a partial side view depicting ejection of the circuit board shown in FIGS. 2–4 from a card slot of the card bay of FIG. 1.

With reference to FIGS. 6 and 7, ejection of the circuit board 104 will now be described. Beginning with the complete insertion orientation shown in FIG. 6, the lever 164 is rotated away from the remainder of the leverage mechanism 132 in a counter-clockwise direction. With reference to FIG. 7, rotation of the lever 164 effects similar counter-clockwise rotation of the arcuate edge 156 and teeth 158 of the second gear member 136 (as indicated by arrow 176) which, in turn, effects clockwise rotation of the first gear member 134 (as indicated by arrow 178). As the lever 164 is rotated, the first tab 144 contacts the outer surface of the lip member 168 of the card guide 108. Continued rotation causes the first tab 144 to be urged against the lip portion 168 and, in that the card guide 108 is securely fixed in position, will ultimately cause the circuit board 104 to be moved away from its electrical connector 130 (in the direction of arrow 180). Once the lever 164 has been moved to the position shown in FIG. 7, the second tabs 146 are positioned outside of the cavity 166, the circuit board 104 is free of the electrical connector 130, and the board may be removed from the card slot 106 by simply drawing the board out of the card bay 100 along the card guide 108.

What is claimed is:

1. A circuit board leverage mechanism, comprising:
   a first gear member configured to rotatably mount to a circuit board, the first gear member including gear teeth and at least one tab that is configured to engage a card guide in which the circuit board may be inserted; and
   a second gear member configured to rotatably mount to the circuit board in proximity to the first gear member, the second gear member including gear teeth that mesh with the gear teeth of the first gear member, the second gear member further including a lever;
   wherein rotation of the lever effects rotation of the second gear member and opposite rotation of the first gear member which causes the at least one tab of the first gear member to engage the card guide and urge the circuit board into or out of contact with an electrical connector.

2. The leverage mechanism of claim 1, wherein the gear teeth of the first gear member are provided on an arcuate edge of the first gear member and the gear teeth of the second gear member are provided on an arcuate edge of the second gear member.

3. The leverage mechanism of claim 2, wherein the arcuate edge of the first gear member has a radius that is different from a radius of the arcuate edge of the second gear member.

4. The leverage mechanism of claim 3, wherein the radius of the arcuate edge of the first gear member is larger than the radius of the arcuate edge of the second gear member.

5. The leverage mechanism of claim 1, wherein the first gear member comprises first and second lateral portions that are configured to be positioned on opposite sides of the circuit board.

6. The leverage mechanism of claim 5, wherein the at least one tab comprises a first tab that extends from the first lateral portion to the second lateral portion, the first tab being configured to engage an outer surface of the card guide when removing the circuit board from the electrical connector.

7. The leverage mechanism of claim 6, wherein the at least one tab further comprises at least one second tab that is configured to engage an inner surface of the card guide when inserting the circuit board into the electrical connector.

8. The leverage mechanism of claim 1, wherein the first and second gear members are mounted to the circuit board with pins positioned at rotation axes of the members.

9. The leverage mechanism of claim 1, further comprising a mounting plate that overlies the first and second gear members, the mounting plate holding the second gear member in place in engagement with the first gear member.

10. The leverage mechanism of claim 9, wherein the lever overlies the mounting plate when the leverage mechanism is in a complete insertion position.

11. A circuit board leverage mechanism, comprising:
    a first gear member configured to rotatably mount to a circuit board, the first gear member including an arcuate edge on which gear teeth are provided, a first tab configured to engage an outer surface of a card guide during circuit board removal, and at least one second tab configured to engage an inner surface of the card guide during circuit board insertion;
    a second gear member configured to rotatably mount to the circuit board in proximity to the first gear member, the second gear member including an arcuate edge on which gear teeth are provided that mesh with the gear teeth of the first gear member, the arcuate edge of the second gear member having a radius that is smaller than the radius of the arcuate edge of the first gear member, the second gear member further including a lever that when actuated effects rotation of the second gear member; and
    a mounting plate that overlies the first and second gear members so as to hold the members in place in engagement with each other;
    wherein the lever of the second gear member overlies the mounting member when the leverage mechanism is in a complete insertion position and wherein rotation of the lever toward an extended position effects rotation of the second gear member and opposite rotation of the first gear member which causes one of the first tab and the at least one second tab to engage the card guide.

12. The leverage mechanism of claim 11, wherein the first gear member comprises first and second lateral portions that are configured to be positioned on opposite sides of the circuit board, the first tab extending from the first lateral portion to the second lateral portion.

13. The leverage mechanism of claim 11, further comprising first and second pins, the first pin extending through the mounting plate and the first gear member and being configured to mount the first gear member to the circuit board, the second pin extending through the mounting plate and the second gear member and being configured to mount the second gear member to the circuit board.

14. A circuit board including a leverage mechanism, the circuit board comprising:
   side surfaces defined by a plurality of edges;
   a first gear member rotatably mounted to the circuit board, the first gear member including gear teeth and at least one tab that is configured to engage a card guide in which the circuit board may be inserted; and
   a second gear member rotatably mounted to the circuit board in proximity to the first gear member, the second gear member including gear teeth that mesh with the gear teeth of the first gear member, the second gear member further including a lever;
   wherein rotation of the lever effects rotation of the second gear member and opposite rotation of the first gear member which causes the at least one tab of the first gear member to engage the card guide and urge the circuit board into or out of contact with an electrical connector.

15. The circuit board of claim 14, wherein the gear teeth of the first gear member are provided on an arcuate edge of the first gear member and the gear teeth of the second gear member are provided on an arcuate edge of the second gear member, wherein the arcuate edge of the first gear member has a radius that is different from a radius of the arcuate edge of the second gear member.

16. The circuit board of claim 15, wherein the radius of the arcuate edge of the first gear is larger than the radius of the arcuate edge of the second gear member.

17. The circuit board of claim 14, wherein the first gear member comprises first and second lateral portions that are positioned on opposite sides of the circuit board.

18. The circuit board of claim 17, wherein the at least one tab comprises a first tab that extends from the first lateral portion to the second lateral portion, the first tab being configured to engage an outer surface of the card guide when removing the circuit board from the electrical connector.

19. The circuit board of claim 18, wherein the at least one tab further comprises at least one second tab that is configured to engage an inner surface of the card guide when inserting the circuit board into the electrical connector.

20. The circuit board of claim 14, further including pins that mount the first and second gear members to the circuit board at rotation axes of the members.

21. The circuit board of claim 14, further comprising a mounting plate that overlies the first and second gear members, the mounting plate holding the second gear member in place in engagement with the first gear member.

22. The circuit board of claim 21, wherein the lever overlies the mounting plate when the leverage mechanism is in a complete insertion position.

23. A circuit board including a leverage mechanism, the circuit board comprising:
   side surfaces defined by a front edge, a rear edge, a top edge, and a bottom edge of the circuit board;
   a first gear member rotatably mounted to the circuit board adjacent the front edge of the circuit board and one of the top and bottom edges of the circuit board, the first gear member including an arcuate edge on which gear teeth are provided, a first tab configured to engage an outer surface of a card guide during circuit board removal, and at least one second tab configured to engage an inner surface of the card guide during circuit board insertion;
   a second gear member rotatably mounted to the circuit board in proximity to the first gear member, the second gear member including an arcuate edge on which gear teeth are provided that mesh with the gear teeth of the first gear member, the arcuate edge of the second gear member having a radius that is smaller than the arcuate edge of the first gear member, the second gear member further including a lever that when actuated effects rotation of the second gear member; and
   a mounting plate that overlies the first and second gear members so as to hold the members in place in engagement with each other;
   wherein the lever of the second gear member overlies the mounting member when the leverage mechanism is in a complete insertion position and wherein rotation of the lever toward an extended position effects rotation of the second gear member and opposite rotation of the first gear member which causes one of the first tab and the at least one second tab to engage the card guide.

24. The circuit board of claim 23, wherein the first gear member comprises first and second lateral portions that are positioned on opposite sides of the circuit board, the first tab extending from the first lateral portion to the second lateral portion.

25. The circuit board of claim 23, further comprising first and second pins, the first pin extending through the mounting plate, the first gear member, and the circuit board, the second pin extending through the mounting plate, the second gear member, and the circuit board.

26. A method for inserting a circuit board, comprising:
   sliding the circuit board along a card slot of a computing device;
   actuating a lever of a leverage mechanism provided on the circuit board so as to cause rotation of a gear member of the leverage mechanism, wherein rotation of the gear member causes opposite rotation of another gear member that includes a tab; and
   continuing actuation of the lever so that the tab engages an inner surface of a card guide provided in the card slot and the circuit board is urged into firm contact with an electrical connector associated with the card slot.

27. A method for removing a circuit board, comprising:
   actuating a lever of a leverage mechanism provided on the circuit board so as to cause rotation of a gear member of the leverage mechanism, wherein rotation of the gear member causes opposite rotation of another gear member that includes a tab; and
   continuing actuation of the lever so that the tab engages an outer surface of a card guide provided in the card slot and the circuit board is pulled out of contact with an electrical connector associated with the card slot.

28. A circuit board assembly, comprising:
   a circuit board; and
   a plurality of intermeshed gears rotatably mounted on the circuit board.

29. The circuit board assembly of claim 28, further comprising a lever that effects rotation of the plurality of gears.

* * * * *